United States Patent
Lee et al.

(10) Patent No.: US 11,564,311 B2
(45) Date of Patent: Jan. 24, 2023

(54) RIGID-FLEXIBLE PRINTED CIRCUIT BOARD AND ELECTRONIC DEVICE INCLUDING SAME

(71) Applicant: SAMSUNG ELECTRONICS CO., LTD., Suwon-si (KR)

(72) Inventors: Youngsun Lee, Suwon-si (KR); Byeongkeol Kim, Suwon-si (KR); Yeongjin Lee, Suwon-si (KR); Jongmin Jeon, Suwon-si (KR); Jaeyoub Jung, Suwon-si (KR); Eunseok Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/171,461

(22) Filed: Feb. 9, 2021

(65) Prior Publication Data
US 2021/0251071 A1 Aug. 12, 2021

(30) Foreign Application Priority Data

Feb. 11, 2020 (KR) .......................... 10-2020-0016474
Nov. 25, 2020 (KR) .......................... 10-2020-0160115

(51) Int. Cl.
*H05K 1/02* (2006.01)
*H05K 1/18* (2006.01)
*H05K 3/46* (2006.01)

(52) U.S. Cl.
CPC ........... *H05K 1/0271* (2013.01); *H05K 1/189* (2013.01); *H05K 3/4691* (2013.01)

(58) Field of Classification Search
CPC ........ H05K 1/02; H05K 1/0271; H05K 1/189; H05K 3/4691

(Continued)

(56) References Cited

U.S. PATENT DOCUMENTS

| 10,015,880 B1 | 7/2018 | Bergman et al. |
| 2017/0196077 A1 | 7/2017 | Iriguchi et al. |

FOREIGN PATENT DOCUMENTS

| JP | 8-18174 | 1/1996 |
| JP | 2005-340420 A2 | 12/2005 |

(Continued)

OTHER PUBLICATIONS

International Search Report and Written Opinion dated Jun. 3, 2021 in corresponding International Application No. PCT/KR2020/001723.

*Primary Examiner* — Tremesha S Willis
(74) *Attorney, Agent, or Firm* — Nixon & Vanderhye P.C.

(57) ABSTRACT

The disclosure relates to a rigid-flexible printed circuit board and an electronic device including same. The electronic device may include: a housing; a first module disposed in one region of the housing; a second module disposed in an other region of the housing and spaced apart from the first module; and a rigid-flexible printed circuit board electrically connecting the first module and the second module, wherein the rigid-flexible printed circuit board includes: a rigid region; a flexible region coupled to the rigid region, wherein a part of the flexible region overlaps the rigid region; and a protective layer laminated on at least one of an upper end or a lower end of the flexible region to cover at least a part of a coupling portion of the rigid region and the flexible region by a designated numerical value, the coupling portion having a tensile strength equal to or greater than a designated strength based on the flexible region being bent. Various other embodiments are possible.

18 Claims, 15 Drawing Sheets

(58) Field of Classification Search
USPC .......................................................... 361/749
See application file for complete search history.

(56) References Cited

FOREIGN PATENT DOCUMENTS

| | | |
|---|---|---|
| JP | 2006-319197 | 11/2006 |
| JP | 2009-224433 | 10/2009 |
| KR | 0168955 B1 | 10/1998 |
| KR | 10-0674303 | 1/2007 |
| KR | 10-0796979 | 1/2008 |
| KR | 10-0993318 | 11/2010 |

RIGID-FLEXIBLE PRINTED CIRCUIT BOARD AND ELECTRONIC DEVICE INCLUDING SAME

CROSS-REFERENCE TO RELATED APPLICATIONS

This application is based on and claims priority under 35 U.S.C. § 119 to Korean Patent Application No. 10-2020-0016474, filed on Feb. 11, 2020 in the Korean Intellectual Property Office, and Korean Patent Application No. 10-2020-0160115, filed on Nov. 25, 2020, in the Korean Intellectual Property Office, the disclosures of which are incorporated by reference herein in their entireties.

BACKGROUND

Field

The disclosure relates to a rigid-flexible printed circuit board and an electronic device including the same.

Description of Related Art

Electronic devices (for example, mobile terminals, smartphones, or wearable devices) may provide various functions. For example, smartphones may provide, in addition to the basic voice communication function, various functions such as a short-range wireless communication (for example, Bluetooth, Wi-Fi, or near-field communication (NFC)) function, a mobile communication ($3^{rd}$ generation (3G), 4G, or 5G) function, a music/moving image playback function, an imaging function, or a navigation function.

Meanwhile, recent electronic devices may include multiple components (for example, one or more printed circuit boards, one or more displays, one or more cameras, or one or more sensor modules). Such components may be connected using various means (for example, a cable or a flexible printed circuit board (FPCB)). As another example, components may be connected by a rigid-FPCB (R-FPCB).

When the flexible region of a rigid-FPCB bends, stress may occur in coupling portions of the flexible region and the rigid region, and the stress may cause damage (e.g., tearing) and/or rupture (e.g., detachment of the rigid portion) in the coupling portions.

The above information is presented as background information only to assist with an understanding of the disclosure. No determination has been made, and no assertion is made, as to whether any of the above might be applicable as prior art with regard to the disclosure.

SUMMARY

Embodiments of the disclosure provide a rigid-FPCB having an improved strength of coupling portions of the rigid region and the flexible region thereof, and an electronic device including the same.

Aspects and advantages of the disclosure are not limited to the above-mentioned aspects and advantages, and other aspects not mentioned herein will be clearly understood from the following description by a person skilled in the art to which the disclosure pertains.

An electronic device according to various example embodiments may include, for example: a housing; a first module including various circuitry disposed in one region of the housing; a second module including various circuitry disposed in an other region of the housing and spaced apart from the first module; and a rigid-flexible printed circuit board configured to electrically connect the first module and the second module. The rigid-flexible printed circuit board may include: a rigid region; a flexible region coupled to the rigid region wherein a part of the flexible region overlaps the rigid region; and a protective layer laminated on at least one of an upper end or a lower end of the flexible region and covering at least a part of a coupling portion of the rigid region and the flexible region by a designated numerical value, the coupling portion having a tensile strength equal to or greater than a designated strength based on the flexible region being bent.

An electronic device according to various example embodiments may include, for example: a housing; a first module including various circuitry disposed in one region of the housing; a second module including various circuitry disposed in an other region of the housing and spaced apart from the first module; and a rigid-flexible printed circuit board configured to electrically connect the first module and the second module. The rigid-flexible printed circuit board may include: a rigid region; a flexible region coupled to the rigid region wherein a part of the flexible region overlaps the rigid region; and a protective layer laminated on at least one of an upper end or a lower end of the flexible region and covering at least a part of a coupling portion of the flexible region and the rigid region, the protective layer having a length in a direction substantially perpendicular to a bending direction in which the flexible region is configured to be bent, the length being greater than a minimum length between lowest points of the coupling portion.

A rigid-flexible printed circuit board configured to electrically connect a first module and a second module according to various example embodiments may include, for example: a rigid region; a flexible region coupled to the rigid region to overlap the rigid region; and a protective layer laminated on at least one of an upper end or a lower end of the flexible region and covering at least a part of a coupling portion of the rigid region and the flexible region by a designated numerical value, the coupling portion having a tensile strength equal to or greater than a designated strength based on the flexible region being bent.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Hereinafter, a description of various example embodiments will be provided with reference to attached drawings. Various embodiments are illustrated in drawings and the relevant detailed description is disclosed, but these example embodiments are not intended to limit various embodiments to a specific form. For example, embodiments can be variously changed, and it would be apparent to a person of ordinary skill in the art.

Figure 1:
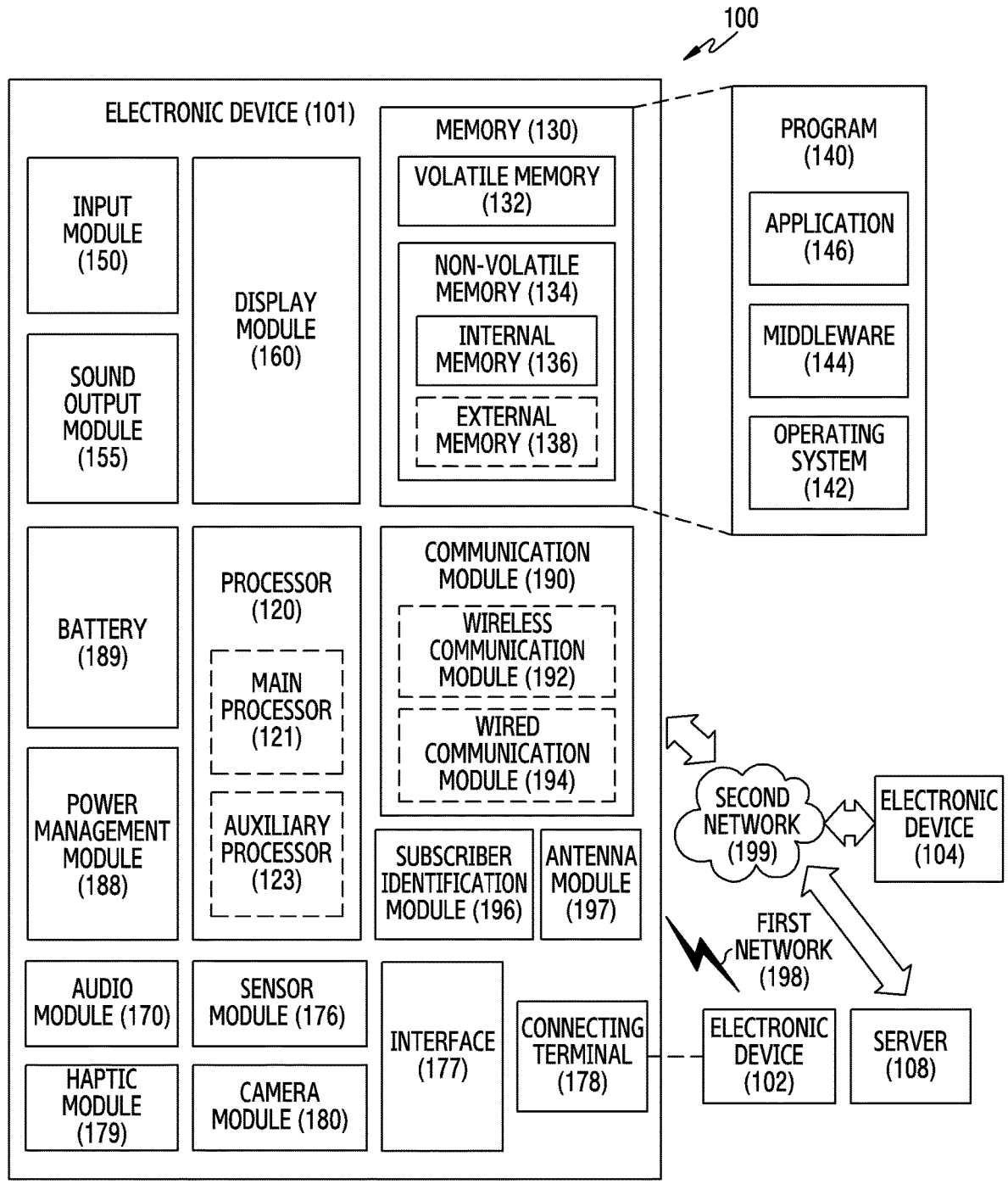
FIG. 1 is a block diagram illustrating an example electronic device in a network environment, according to various embodiments.

FIG. 1 is a block diagram illustrating an example electronic device 101 in a network environment 100 according to various embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

According to an embodiment, an electronic device 101 may include at least one rigid-flexible printed circuit board (R-FPCB). The rigid-flexible printed circuit board may electrically (or operatively) connect an element (or a module) (e.g., a display module 160, a sensor module 176, an interface 177, or a camera module 180) included in the electronic device 101 to a main printed circuit board (not shown), or electrically connect a main printed circuit board and/or a sub printed circuit board which are disposed in different regions while being spaced apart from each other.

The electronic device 101 according to an embodiment may be an electronic device of a normal type wherein the electronic device cannot be bent or folded, a foldable type wherein the electronic device can be folded inwards and/or outwards with reference to at least one axis, a rollable type wherein the display module 160 can be rolled, or a slidable type wherein the display module 160 slides to enable expansion or reduction of a display region. According to an embodiment, the display module 160 may provide a rectangular screen in a unfolded state. According to various embodiments, the display module 160 is not limited to provide only a rectangular screen, and may include a flexible display which has a quadrangular shape having curved corners and a quadrangular shape having a notch region, depending on a type or design of the electronic device 101. In the disclosure, for convenience of description, it is assumed that the display module 160 has a rectangular shape having the height longer than the width, but various modifications are possible and the disclosure is not limited thereto.

Figure 2A:
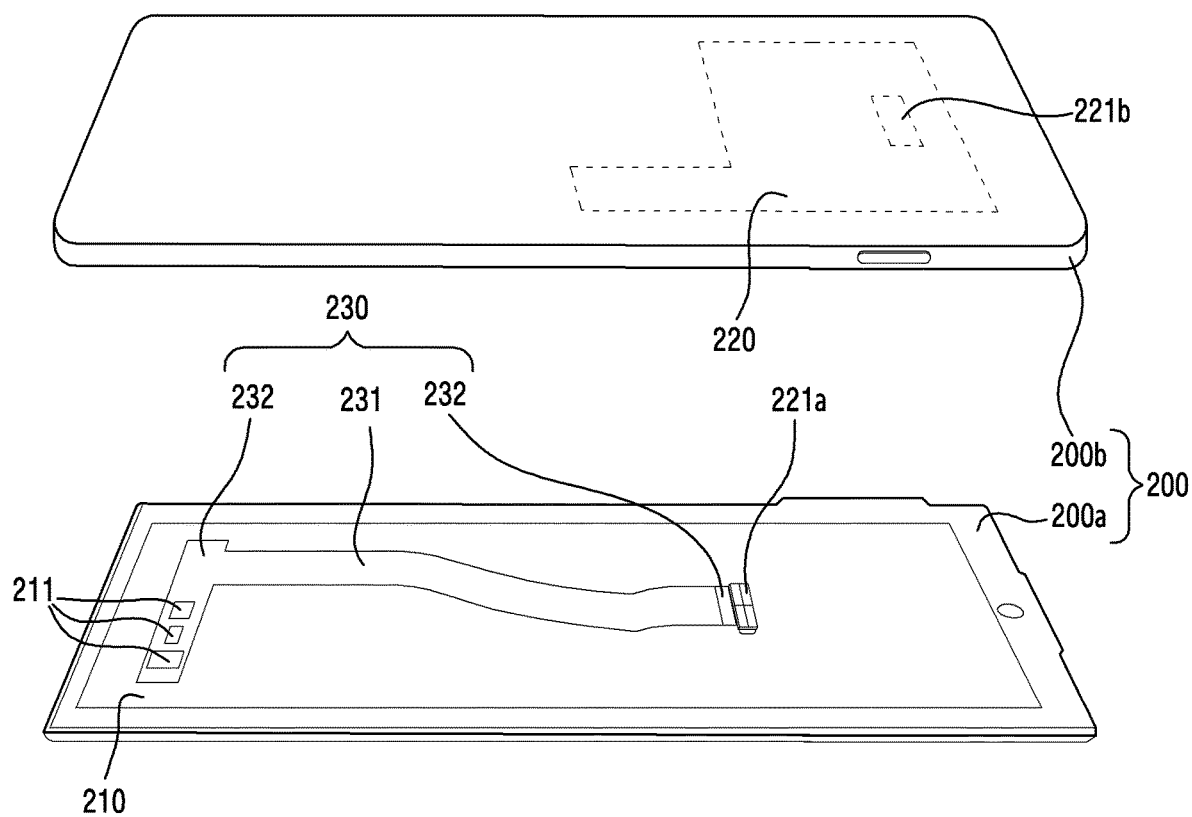
FIG. 2A is a diagram illustrating an example electronic device including a rigid-flexible printed circuit board according to various embodiments.
Figure 2B:
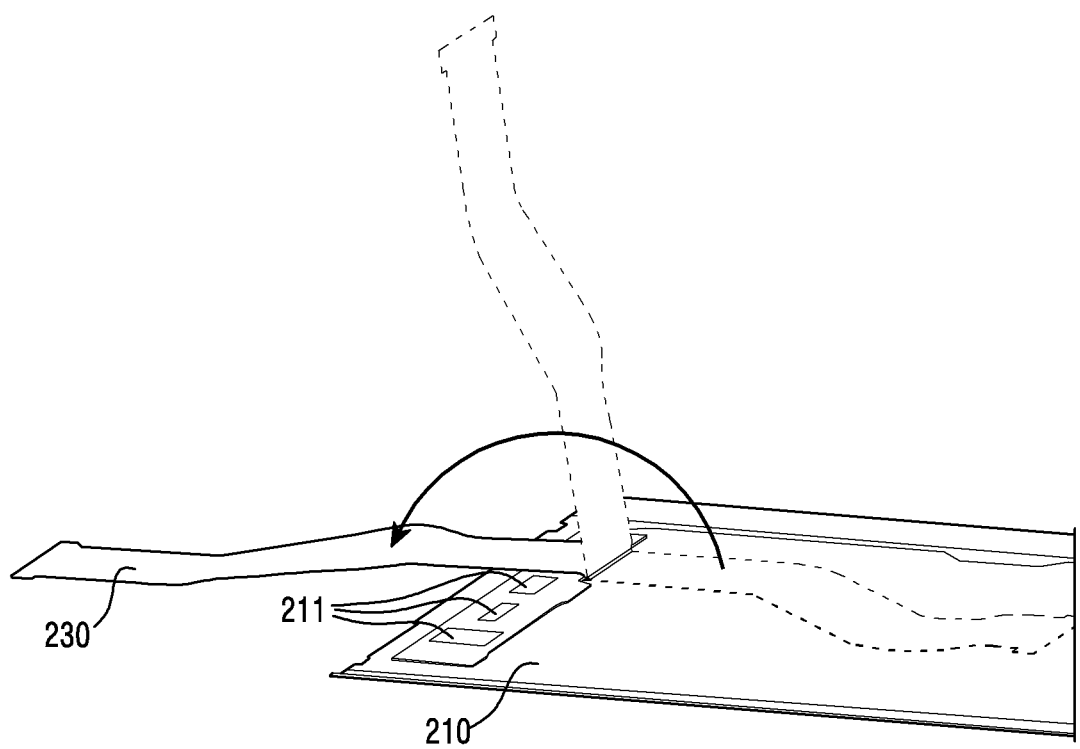
FIG. 2B is a diagram illustrating an example in which a rigid-flexible printed circuit board of an electronic device is bent according to various embodiments.

FIG. 2A is a diagram illustrating an example electronic device including a rigid-flexible printed circuit board according to various embodiments, and FIG. 2B is a diagram an example in which a rigid-flexible printed circuit board of an electronic device is bent according to various embodiments.

Referring to FIGS. 2A and 2B, an electronic device (e.g., the electronic device 101) according to an embodiment may include a housing 200, a display module 210, a printed circuit board 220, and a rigid-flexible printed circuit board 230. At least one of elements of the electronic device of FIGS. 2A and 2B according to various embodiments may be the same as or similar to at least one of elements of the electronic device 101 of FIG. 1, and thus, hereinafter, the description of overlapping elements may not be repeated here.

According to various embodiments, the housing 200 may include a first housing 200a and a second housing 200b which are coupled (or fastened) to each other. The first housing 200a may be a front housing of the electronic device, and the second housing 200b may be a rear housing of the electronic device.

According to various embodiments, the display module 210 (e.g., the display module 160) may be disposed in the first housing 200a. The display module 210 may be electrically connected to the printed circuit board 220 through the rigid-flexible printed circuit board 230.

According to various embodiments, the display module 210 may be configured to enable a camera module (e.g., the camera module 180 of FIG. 1) and/or a sensor module (e.g., the sensor module 176 of FIG. 1) to detect the external environment. For example, the display module 210 may have a light-transmissive region and/or an opening formed therethrough such that a camera module and/or a sensor module disposed in an inner space of an electronic device (e.g., the electronic device 101 of FIG. 1) can be configured to be in contact with or visible to the external environment. According to an embodiment, a region of the display module 210 which faces the camera module and/or the sensor module is a part of a region on which contents are displayed, and may be formed to be a light-transmissive region having a designated transmissivity. According to an embodiment, the light-transmissive region may be formed to have the transmissivity within a range of approximately 20% to 40%. The light-transmissive region may include a region overlapping a field of view (FOV) of the camera module, through which light passes and is turned into an image by an image sensor. For example, the light-transmissive region of the display module 210 may include a region having the lower pixel density and/or the lower wiring density than the periphery, and the camera module may include an under display camera (UDC).

According to various embodiments, the printed circuit board 220 may be disposed in the second housing 200*b*, and may, for example, be a main printed circuit board on which multiple electronic components or parts including various circuitry (e.g., the processor 120, the memory 130, the communication module 190, the audio module 170, and/or the power management module 188 of FIG. 1) are mounted.

According to various embodiments, the rigid-flexible printed circuit board 230 may electrically connect some modules to each other, which are electrically separated from each other, among various modules included in the electronic device. For example, the rigid-flexible printed circuit board 230 may electrically (or operatively) connect the display module 210 and the printed circuit board 220.

Figure 4:
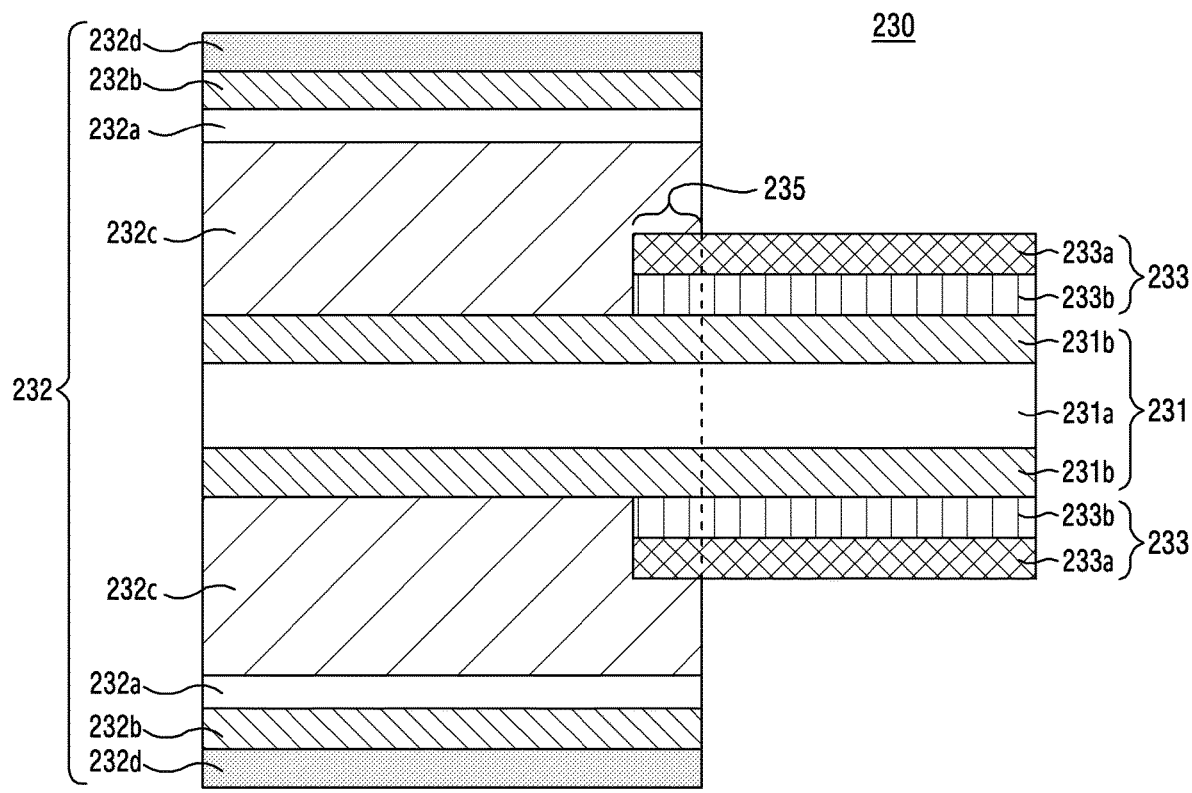
FIG. 4 is a cross-sectional view illustrating an example coupling portion of a rigid-flexible printed circuit board according to various embodiments.
Figure 5:
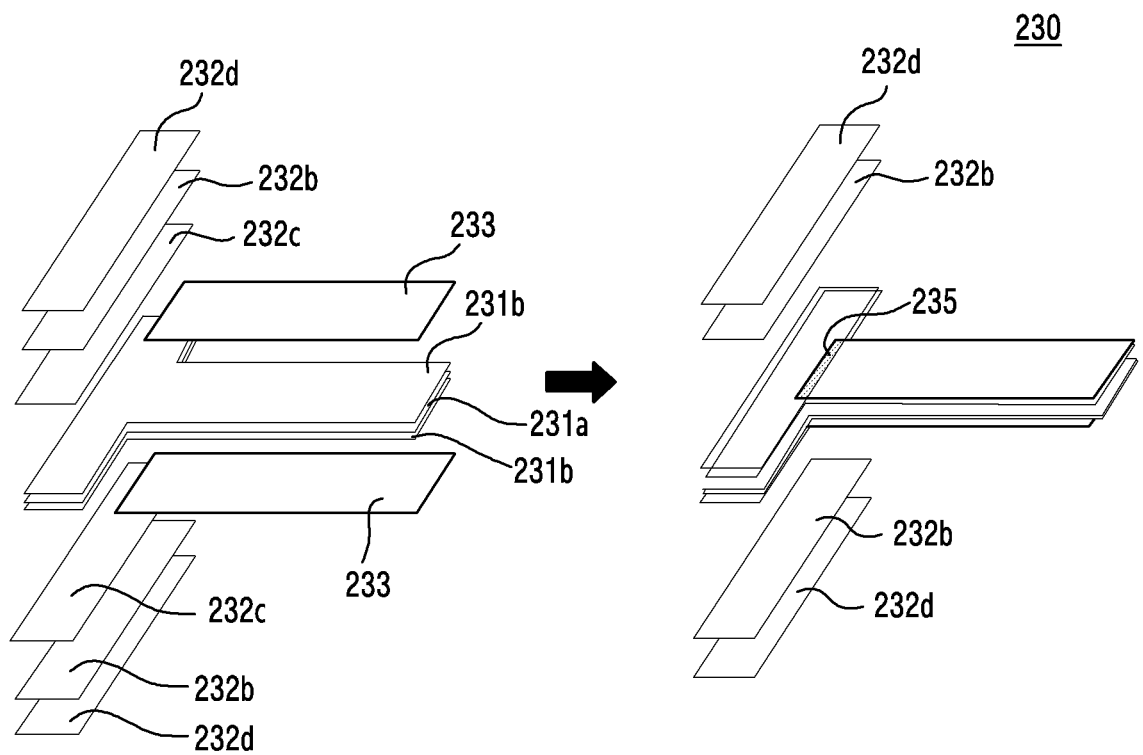
FIG. 5 is an exploded perspective view of a rigid-flexible printed circuit board according to various embodiments.

According to various embodiments, the rigid-flexible printed circuit board 230 may include a flexible region 231, a rigid region 232, and a protective layer (not shown) (e.g., a protective layer 233 of FIGS. 4 and 5).

According to various embodiments, the flexible region 231 may have flexibility. For example, as illustrated in FIG. 2B, the flexible region 231 may be bent in an arrow direction (hereinafter, a bending direction) while being coupled to the display module 210. The bending direction may be a direction rotating around a boundary between the flexible region 231 and the rigid region 232.

According to various embodiments, the rigid region 232 may include a rigid region that is not easily bendable, and may overlap at least a part of the flexible region 231.

According to various embodiments, the rigid region 232 may be formed on each of both ends of the rigid-flexible printed circuit board 230. As illustrated in FIGS. 2A and 2B, the rigid region 232 formed on one end of the rigid-flexible printed circuit board 230 may include at least one part 211, and the rigid region 232 formed on the other end of the rigid-flexible printed circuit board 230 may be coupled (e.g., inserted) to a connector 221*b* (e.g., a male connector) included in the printed circuit board 220 through a connector 221*a* (e.g., a female connector). According to an embodiment, the rigid region 232 may be formed on one end of the rigid-flexible printed circuit board 230. In FIG. 2A, it is illustrated, by way of non-limiting example, that the rigid region 232 formed on one end of the rigid-flexible printed circuit board 230 is integrally formed with the display module 210, but according to an embodiment, the rigid region 232 formed on one end of the rigid-flexible printed circuit board 230 may be connected to the display module 210 through a fastening means (e.g., a connector).

According to various embodiments, when the flexible region 231 is bent, a protective layer (e.g., a protective layer 233 of FIGS. 4 and 5) may prevent and/or reduce damage (e.g., tearing) and/or rupture (e.g., detachment of a rigid portion) of a coupling portion, which may be incurred by stress occurring, due to a tensile force occurring at the flexible region 231 and/or the rigid region 232, at at least a part of the coupling portion (e.g., cut regions 602, 702, and 802 of FIGS. 6A to 8) where the rigid region 232 and the flexible region 231 overlap each other. For example, a protective layer (e.g., a protective layer 233 of FIGS. 4 and 5) may be formed to have a designated numerical value (e.g., a size, a range, a ratio, etc.) in order to prevent and/or reduce damage and/or rupture incurred at at least a part of a coupling portion (e.g., in order to enable a coupling portion to have a tensile strength which is equal to or greater than a designated strength). The designated numerical value may be configured such that the protective layer (e.g., a protective layer 233 of FIGS. 4 and 5) covers, in the horizontal direction (or a direction substantially perpendicular to the bending direction, e.g., the X-axis direction of FIGS. 6A to 8), beyond a point (e.g., the lowest points 601*a* and 601*b* of U-shaped cut regions 602 of FIGS. 6A to 6C, end points 701*a* and 701*b* of curved portions of R-shaped cut regions 702 of FIG. 7, and corner points 801*a* and 801*b* of L-shaped cut regions 802 of FIG. 8) having the maximum stress occurring at the coupling portion (e.g., cut regions 602, 702, and 802 of FIGS. 6A to 8). According to an embodiment, a protective layer (e.g., a protective layer 233 of FIGS. 4 and 5) may be laminated on a part of the flexible region 231 by a designated numerical number, to cover, in the vertical direction (or the bending direction, e.g., the Y-axis direction of FIGS. 6A to 8), beyond a point having the high stress occurring when the flexible region 231 is bent. A protective layer (e.g., a protective layer 233 of FIGS. 4 and 5) may be laminated not to overlap via holes (e.g., via holes 603, 703, and 803 of FIGS. 6A to 8) formed through at least a part of the rigid region. The protective layer will be described in greater detail below with reference to FIGS. 6A to 8. The description above has been given with reference to the example in which the rigid-flexible printed circuit board 230 connects the display module 210 and the printed circuit board 220. However, an electronic device may connect different modules to each other, among various modules (e.g., a main printed circuit board, a sub printed circuit board, a camera module, an interface module, or a sensor module) included in the electronic device. For example, an electronic device may connect a main printed circuit board and a sub printed circuit board through the rigid-flexible printed circuit board 230.

Figure 3A:
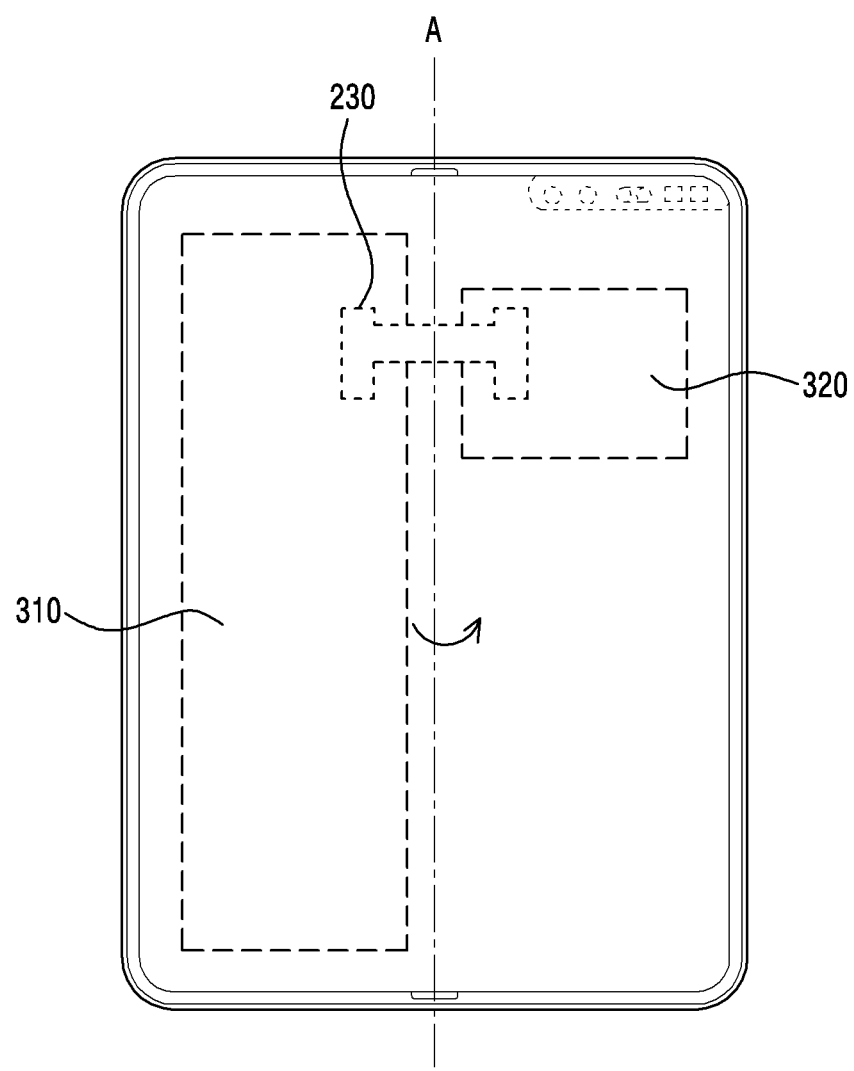
FIG. 3A is a diagram illustrating an electronic device including a rigid-flexible printed circuit board according to various embodiments.
Figure 3B:
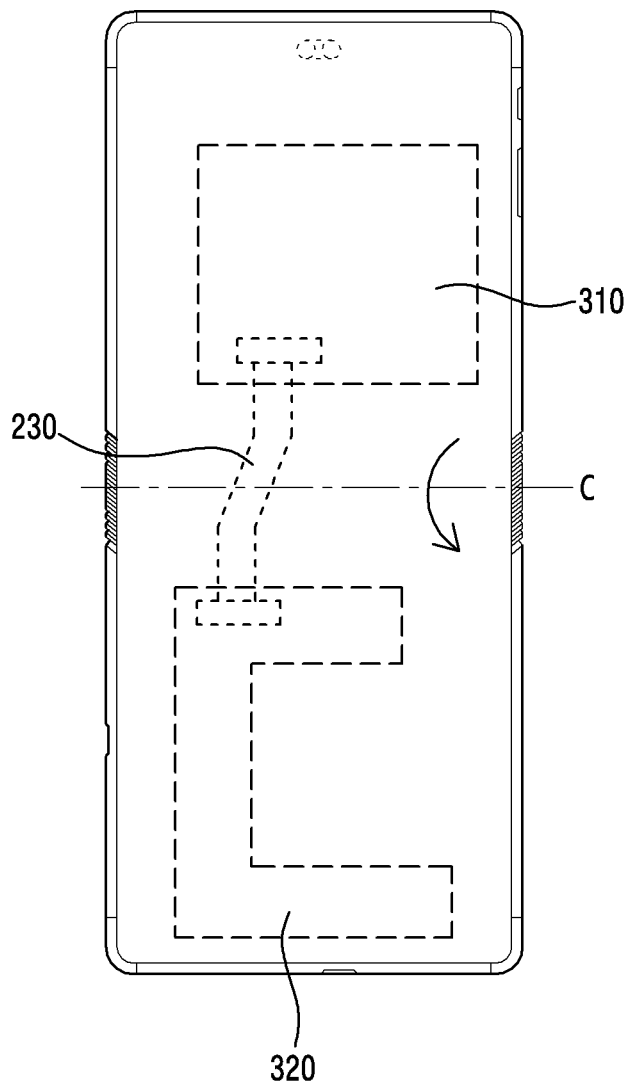
FIG. 3B is a diagram illustrating an electronic device including a rigid-flexible printed circuit board according to various embodiments.

FIG. 3A is a diagram illustrating an example electronic device including a rigid-flexible printed circuit board according to various embodiments, and FIG. 3B is a diagram illustrating an example electronic device including a rigid-flexible printed circuit board according to various embodiments.

Referring to FIGS. 3A and 3B, an electronic device (e.g., the electronic device 101 of FIG. 1) according to various embodiments may be an foldable electronic device which can be folded inwards and/or outwards (infolding or outfolding) with reference to at least one rotation shaft or axis. For example, as illustrated in FIG. 3A, an electronic device may be folded inwards (e.g., infolding) with reference to the vertical axis (A-axis). As another example, as illustrated in FIG. 3B, an electronic device may be folded inwards with reference to the horizontal axis (C-axis).

According to various embodiments, an electronic device may include a first printed circuit board 310 (e.g., a main printed circuit board), a second printed circuit board 320 (e.g., a sub printed circuit board), and a rigid-flexible printed circuit board 230.

According to various embodiments, the first printed circuit board 310 and the second printed circuit board 320 may include multiple parts (elements). The first printed circuit board 310 and the second printed circuit board 320 may be electrically connected to each other through the rigid-flexible printed circuit board 230.

According to various embodiments, as described in FIGS. 2A and 2B, the rigid-flexible printed circuit board 230 may include a protective layer which is disposed or laminated to cover beyond a point having the maximum stress, to prevent and/or reduce damage and/or rupture due to bending. The rigid-flexible printed circuit board 230 is similar to that of FIGS. 2A and 2B, and thus, the detailed description thereof will not be repeated here.

The electronic device of FIGS. 3A and 3B may further include various elements (e.g., a housing, a display module, a processor, a communication module, or a sensor module), and at least one of the elements may be the same as or similar to at least one of the elements of the electronic device 101 of FIG. 1. For convenience of description, the detailed description of the same or similar elements will be omitted.

The foldable electronic device of FIGS. 3A and 3B has been described with reference to the example in which the first printed circuit board 310 and the second printed circuit board 320 are connected to each other through the rigid-flexible printed circuit board 230. However, the foldable electronic device of FIGS. 3A and 3B may connect different modules to each other, among various modules (e.g., a display module, a camera module, an interface module, or a sensor module), through the rigid-flexible printed circuit board 230.

Figure 3C:
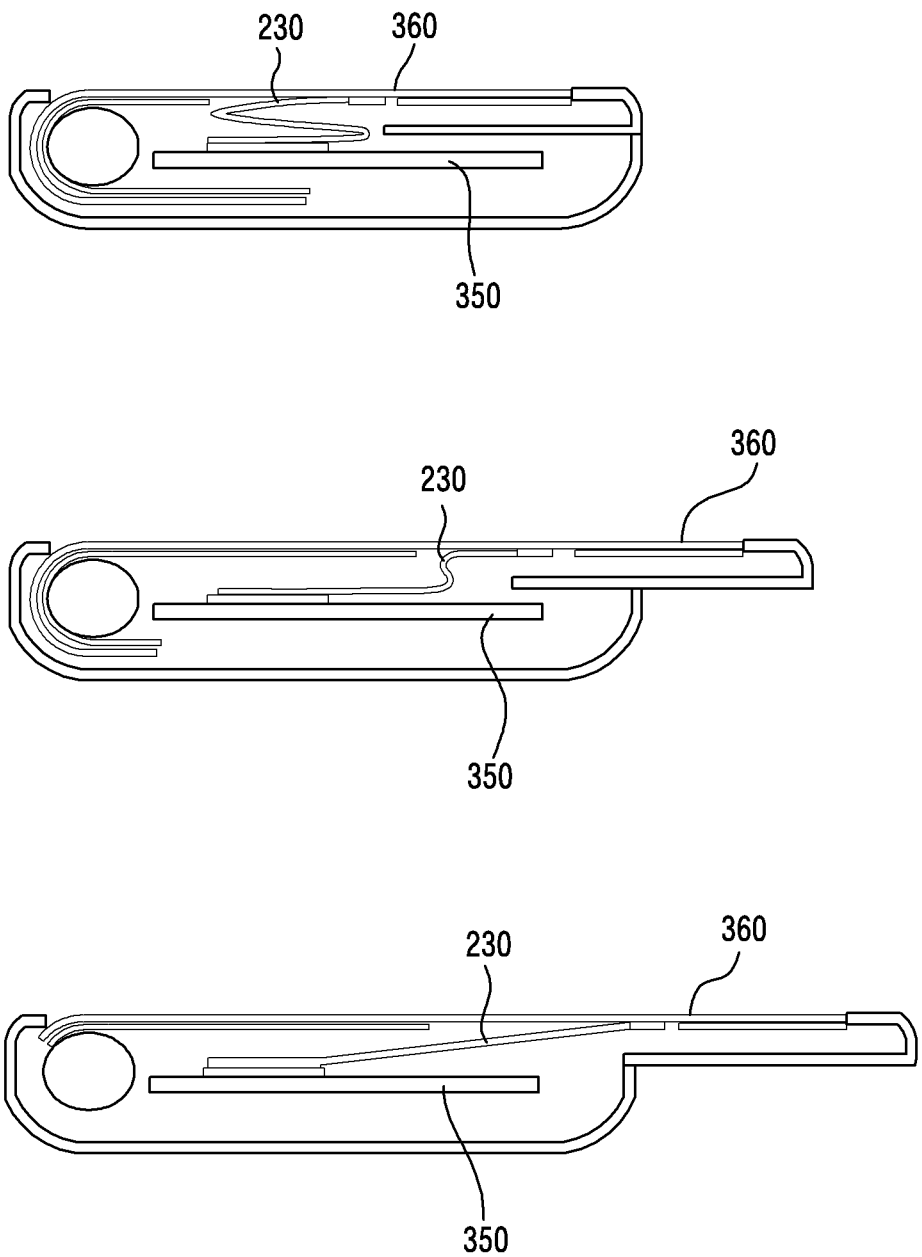
FIG. 3C is a diagram illustrating an electronic device including a rigid-flexible printed circuit board according to various embodiments.

FIG. 3C is a diagram illustrating an example electronic device including a rigid-flexible printed circuit board according to various embodiments.

Referring to FIG. 3C, an electronic device (e.g., the electronic device 101) according to various embodiments may be a slidable electronic device in which a display module 360 (e.g., the display module 160 of FIG. 1) slides to enable expansion or reduction of a display region of the display module 360. For example, as illustrated in FIG. 3C, an electronic device may slide out in the outward direction (e.g., the rightward direction of FIG. 3C) to expand a display region, and slide in in the inward direction (e.g., the leftward direction of FIG. 3C) in a state where a display region has been expanded, to reduce the display region.

According to various embodiments, an electronic device may include a rigid-flexible printed circuit board 230, a printed circuit board 350, and a display module 360.

According to various embodiments, the printed circuit board 350 and the display module 360 may be electrically connected to each other through the rigid-flexible printed circuit board 230.

According to various embodiments, at least a part of the rigid-flexible printed circuit board 230 may be repeatedly folded and unfolded according to a sliding motion. As described in FIGS. 2A and 2B, the rigid-flexible printed circuit board 230 may include a protective layer which is disposed or laminated to cover beyond a point having the maximum stress, to prevent and/or reduce damage and/or rupture from being incurred during sliding. The rigid-flexible printed circuit board 230 is similar to that of FIGS. 2A and 2B, and thus, the detailed description thereof will be omitted.

The electronic device of FIG. 3C may further include various elements, and at least one of the elements may be the same as or similar to at least one of the elements of the electronic device 101 of FIG. 1. For convenience of description, the detailed description of the same or similar elements may not be repeated here.

The slidable electronic device of FIG. 3C has been described with reference to the example in which the printed circuit board 350 and the display module 360 are connected to each other through the rigid-flexible printed circuit board 230. However, the slidable electronic device of FIG. 3C may connect different modules to each other, among various modules (e.g., a main printed circuit board, a sub printed circuit board, a camera module, an interface module, or a sensor module), through the rigid-flexible printed circuit board 230. According to an embodiment, various embodiments can be applied even to a rollable electronic device to enable a display module (e.g., the display module 160 of FIG. 1) to be rolled.

A foldable electronic device, a rollable electronic device, and/or a slidable electronic device electronically connects modules to each other using the rigid-flexible printed circuit board 230 including a single-sided flexible copper clad laminate (FCCL) as a flexible region. However, the single-sided flexible copper clad laminate may be vulnerable to being torn, due to a thin thickness thereof. Therefore, as shown in various embodiments, when a protective layer is disposed or laminated to cover beyond a point having the maximum stress occurring during bending of the rigid-flexible printed circuit board 230, the single-sided flexible copper clad laminate can be prevented from and/or avoid being torn.

FIG. 4 is a cross-sectional view of a coupling portion of a rigid-flexible printed circuit board according to various embodiments, and FIG. 5 is an exploded perspective view of a rigid-flexible printed circuit board according to various embodiments.

Referring to FIGS. 4 and 5, a flexible region 231 of a rigid-flexible printed circuit board 230 according to various embodiments may include a base film (or substrate) 231a and a copper clad layer 231b. For example, the flexible region 231 may include a flexible copper clad laminate (FCCL) obtained by at least partially laminating at least one copper clad layer on at least one of an upper end or a lower end of a polyimide film. In FIGS. 4 and 5, it is illustrated that the flexible region 231 includes two copper clad layers 231b, but according to an embodiment, the flexible region 231 may include a single copper clad layer 231b or include three or more copper clad layers 231b.

According to various embodiments, a rigid region 232 may be formed by bonding or laminating at least one copper clad layer 232b to an upper end and a lower end of at least a part of the flexible region 231 by means of, for example, a curable material 232c (e.g., prepreg (PPG)). The rigid region 232 may include a protective layer 232d in order to prevent and/or reduce corrosion of the at least one copper clad layer 232b and/or damage of the at least one copper clad layer 232b, the damage being incurred due to the external impact. For example, the protective layer 232d may be formed by applying (e.g., coating and/or printing) photoimageable solder resist (PSR) onto the copper clad layer 232b positioned on the top end and the bottom end of the rigid region 232.

According to various embodiments, a base film 232a may be disposed between the copper clad layer 232b and the curable material 232c. FIGS. 4 and 5 illustrate that the rigid field 232 is formed by laminating the copper clad layer 232b on an upper end and a lower end of the flexible region 231, but according to an embodiment, the rigid region 232 may be formed by laminating at least one copper clad layer 232b on one of the upper end or the lower end of the flexible region 231.

According to various embodiments, a protective layer 233 may be laminated on (bonded or attached to) at least one of the upper end or the lower end of the flexible region 231, to protect the copper clad layer 231b of the flexible region 231. For example, the protective layer 233 may prevent and/or reduce corrosion of the copper clad layer 231b and/or damage of the copper clad layer 231b, the damage being incurred due to the external impact. The protective layer 233 may be a coverlay film obtained by coating a base film (e.g., a polyimide film) 233a with an adhesive agent 233b.

According to various embodiments, a section 235 of the protective layer 233 may overlap the curable material 232c of the rigid region 232. For example, the portion 235 of the protective layer 233 may overlap the curable material 232c of the rigid region 232, to prevent and/or reduce damage and/or rupture of a coupling portion of the flexible region 231 and the rigid region 232, which may be incurred due to stress occurring when the flexible region 231 is bent.

According to various embodiments, the rigid-flexible printed circuit board 230 may be made of various materials such as paper phenolic (FR-2, FR-3, and the like), epoxy (FR-4, FR-5, G-2, G-11, and the like), polyamide, BT metal, Teflon, ceramic, and a halogen-free material, but the disclosure is not limited thereto.

According to various embodiments, at least one copper clad layer (e.g., the copper clad layers 231b and 232b) may include a high frequency copper clad laminate made of a material which can correspond to high-speed signal transmission. For example, a transmission speed of a signal in a printed circuit board (e.g., the rigid-flexible printed circuit board 230) is inversely proportional to the permittivity of a material, and thus, a transmission speed of a signal can be increased using a material having the low permittivity. For example, the rigid-flexible printed circuit board 230 may include a flexible printed circuit board type radio frequency cable (FRC).

Figure 6A:
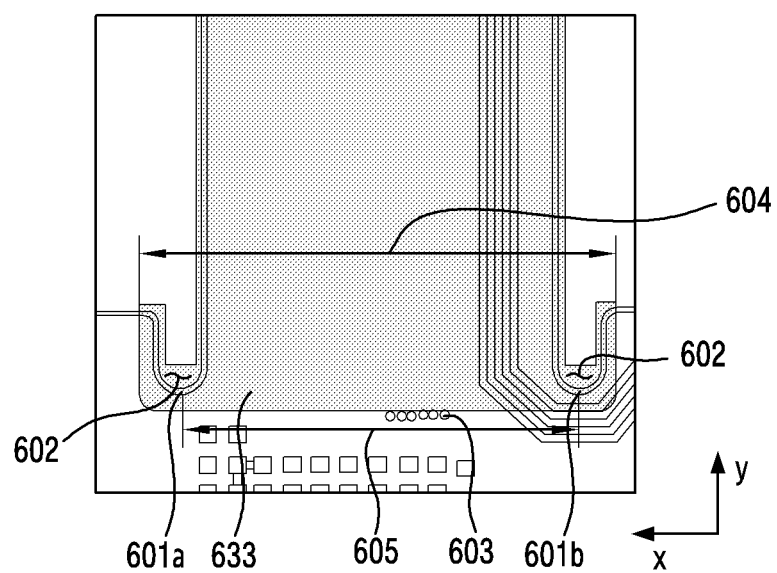
FIG. 6A is a diagram illustrating an example in which a protective layer is laminated on a flexible region according to various embodiments.
Figure 6B:
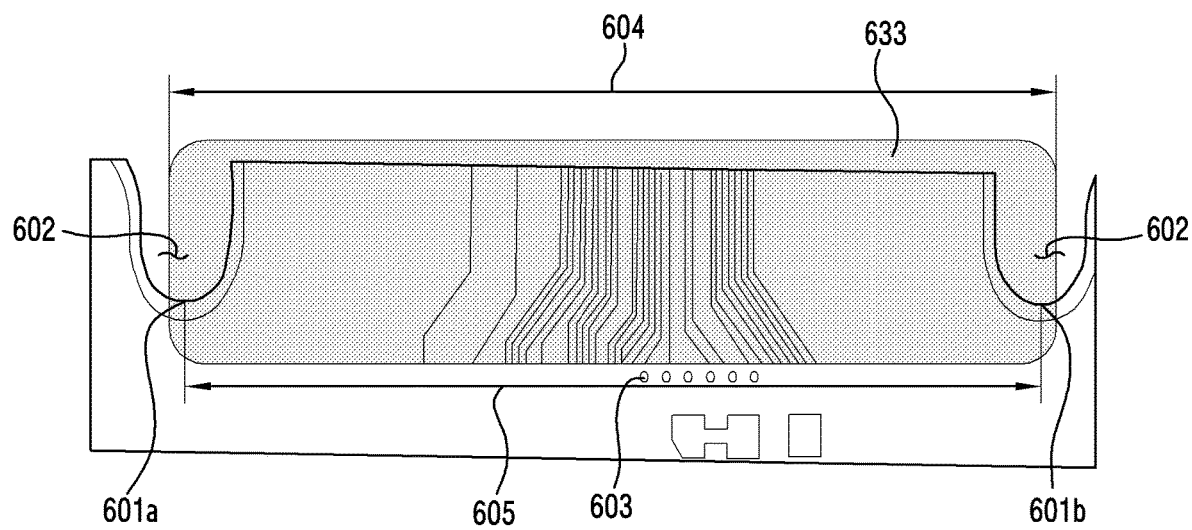
FIG. 6B is a diagram illustrating an example in which a protective layer is laminated on a flexible region according to various embodiments.
Figure 6C:
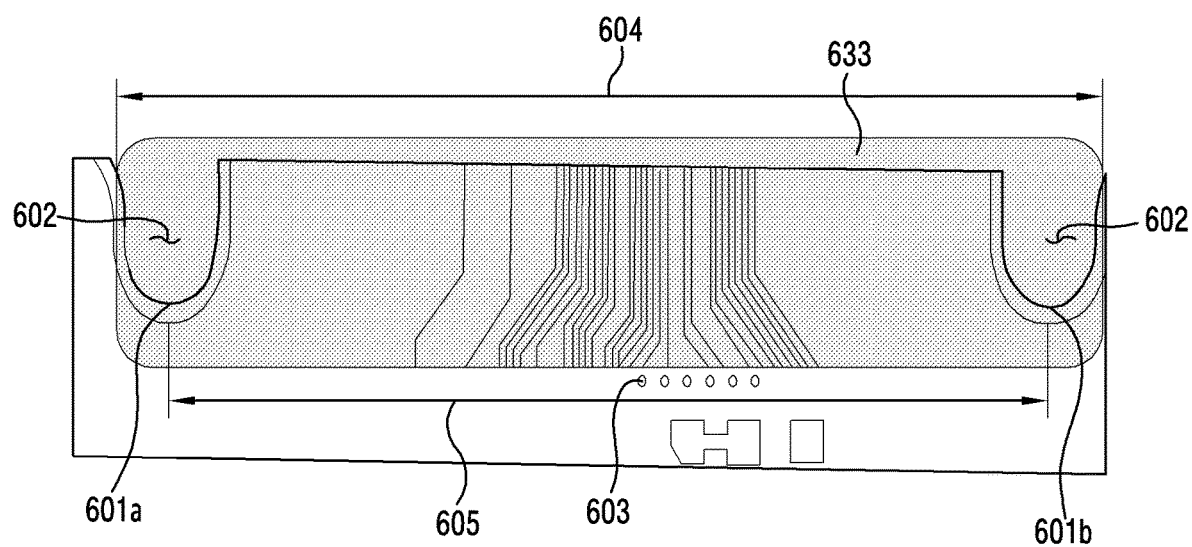
FIG. 6C is a diagram illustrating example in which a protective layer is laminated on a flexible region according to various embodiments.

FIG. 6A is a diagram illustrating an example in which a protective layer is laminated on a flexible region according to various embodiments, FIG. 6B is a diagram illustrating an example in which a protective layer is laminated on a flexible region according to various embodiments, and FIG. 6C is a diagram illustrating an example in which a protective layer is laminated on a flexible region according to various embodiments. Elements of the rigid-flexible printed circuit board of FIGS. 6A, 6B and 6C according to various embodiments may be the same as or similar to the elements of the rigid-flexible printed circuit board 230 of FIGS. 2A to 5.

Referring to FIGS. 6A, 6B and 6C, a rigid-flexible printed circuit board (e.g., the rigid-flexible printed circuit board 230) according to an embodiment may include U-shaped cut regions 602 disposed on a coupling portion where a rigid region and a flexible region at least partially overlap each other.

According to various embodiments, when a protective layer 633 (e.g., the protective layer 233 of FIGS. 4 and 5) rotates around a first axis (e.g., the X-axis) to be bent, stress may occur on the U-shaped cut regions 602. For example, stress may occur at the maximum level at the lowest points 601a and 601b of the U-shaped cut regions 602. The protective layer 633 may be bonded to or laminated on an upper end and/or a lower end of a flexible region by a designated numerical value to cover the lowest points 601a and 601b. For example, a size (e.g., a width) 604 of the protective layer 633 in the first axis (e.g., the X-axis) direction (e.g., the horizontal direction) may exceed a distance 605 between the lowest points 601a and 601b. For example, as illustrated in FIG. 6A, the size of the protective layer 633 in the first axis direction may be formed to entirely cover the U-shaped cut regions 602, or, as illustrated in FIGS. 6B and 6C, may be formed to cover the U-shaped cut regions 602 by more than a designated ratio (e.g., 50%).

According to various embodiments, the protective layer 633 may at least partially overlap a rigid region (e.g., the curable material 232c of the rigid region 232) to be excessive in a second axis (e.g., the Y-axis) direction (e.g., the vertical direction) as much as a designated size (e.g., approximately 0.4 mm) (or ratio) with reference to the lowest points 601a and 601b. The protective layer 633 may be laminated not to overlap at least one via hole 603 formed through the rigid region.

According to various embodiments, the protective layer 633 may be laminated on (bonded or attached to) at least one of an upper end or a lower end of a flexible region (e.g., the flexible region 231 of FIGS. 2A to 5). In addition, as illustrated in FIGS. 6A, 6B and 6C, the protective layer 633 laminated on (bonded or attached to) at least one of the upper end or the lower end of the flexible region may be formed in a shape covering beyond the lowest points 601a and 601b of the U-shaped cut regions 602.

The various embodiments described above can improve a tensile strength of a rigid-flexible printed circuit board. For example, an experiment for comparing a protective layer 633 formed up to the lowest points 601a and 601b and another protective layer 633 formed excessively beyond the lowest points 601a and 601b (e.g., formed to fully cover the U-shaped cut regions 602 as illustrated in FIG. 6A) shows that the tensile strength is improved on average by approximately 555 gf as shown in Table 1 below.

TABLE 1

|  | Non-excessive (gf) | Excessive (gf) | Improvement (gf) |
| --- | --- | --- | --- |
| 1 | 1192 | 1908 | 716 |
| 2 | 1664 | 1740 | 76 |
| 3 | 1684 | 2190 | 506 |
| 4 | 1679 | 2246 | 567 |
| 5 | 1124 | 2037 | 913 |
| Average | 1468.6 | 2024.2 | 555.6 |
| Maximum | 1684 | 2246 | 562 |
| Minimum | 1124 | 1740 | 616 |

Figure 7:
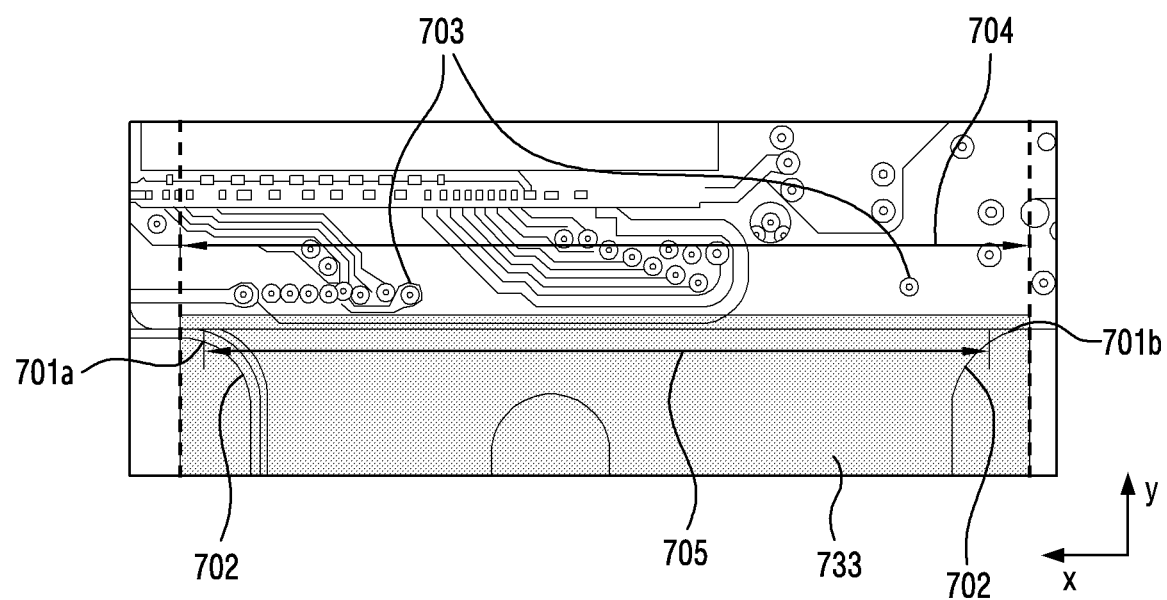
FIG. 7 is a diagram illustrating an example in which a protective layer is laminated on a flexible region according to various embodiments.

FIG. 7 is a diagram illustrating example in which a protective layer is laminated on a flexible region according to various embodiments. Elements of a rigid-flexible printed circuit board of FIG. 7 according to various embodiments may be the same as or similar to the elements of the rigid-flexible printed circuit board 230 of FIGS. 2A to 5.

Referring to FIG. 7, a rigid-flexible printed circuit board (e.g., the rigid-flexible printed circuit board 230) according to an embodiment may include R (round)-shaped cut regions 702 disposed on a coupling portion where a rigid region and a flexible region overlap each other.

According to various embodiments, when a protective layer 733 (e.g., the protective layer 233 of FIGS. 4 and 5) rotates around a first axis (e.g., the X-axis) to be bent, stress may occur on the R-shaped cut regions 702. For example, stress may occur at the maximum level at end points 701a and 701b where the curvatures of the R-shaped cut regions 702 finish. The protective layer 733 may be bonded to or laminated on an upper end and/or a lower end of the flexible region by a designated numerical value to cover the end points 701a and 701b. For example, a size (e.g., a width) 704 of the protective layer 733 in the first axis (e.g., the X-axis) direction (e.g., the horizontal direction) may exceed a distance 705 between the end points 701a and 701b. The protective layer 733 may at least partially overlap a rigid region (e.g., the curable material 232c of the rigid region 232) to be excessive in a second axis (e.g., the Y-axis) direction (e.g., the vertical direction) as much as a designated size (e.g., approximately 0.4 mm) (or ratio) with reference to the end points 701a and 701b. The protective layer 733 may be laminated not to overlap at least one via hole 703 formed through the rigid region.

Figure 8:
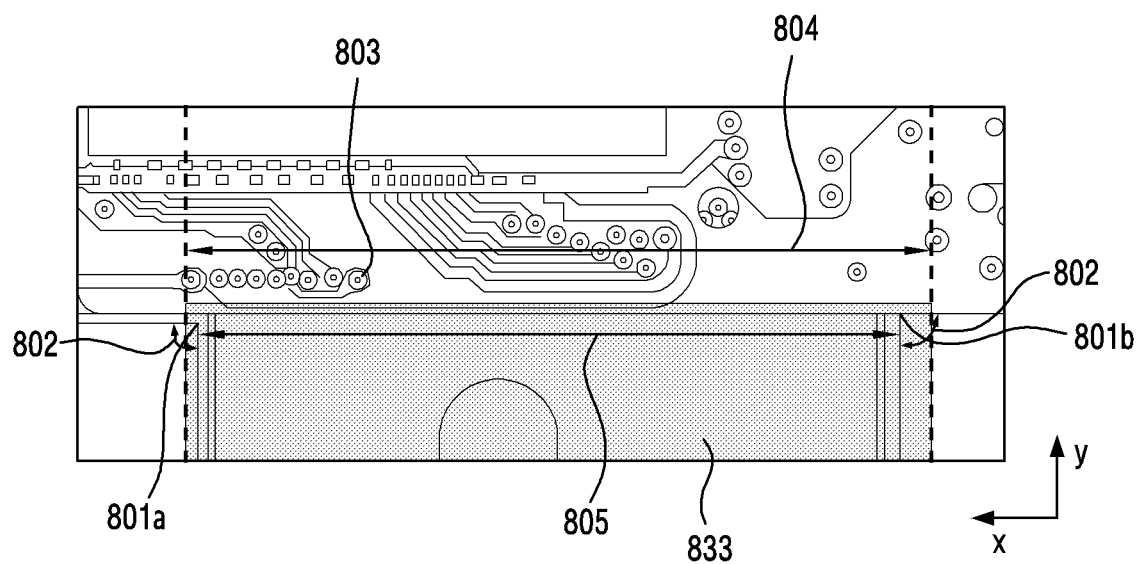
FIG. 8 is a diagram illustrating an example in which a protective layer is laminated on a flexible region according to various embodiments.

FIG. 8 is a diagram illustrating example in which a protective layer is laminated on a flexible region according to various embodiments.

Referring to FIG. 8, a rigid-flexible printed circuit board (e.g., the rigid-flexible printed circuit board 230) according to an embodiment may include L-shaped cut regions disposed on a coupling portion of a rigid region and a flexible region. Elements of the rigid-flexible printed circuit board of FIG. 8 according to various embodiments may be to the same as or similar to the elements of the rigid-flexible printed circuit board 230 of FIGS. 2A to 5.

According to various embodiments, when a protective layer 833 (e.g., the protective layer 233 of FIGS. 4 and 5) rotates around a first axis (e.g., the X-axis) to be bent, stress may occur on L-shaped cut regions 802. For example, stress may occur at the maximum level at corner points 801a and 801b of the L-shaped cut regions 802. The protective layer 833 may be bonded to or laminated on an upper end and/or a lower end of the flexible region by a designated numerical value, to cover the corner points 801a and 801b. For example, a size (e.g., a width) 804 of the protective layer 833 in the first axis (e.g., the X-axis) direction (e.g., the horizontal direction) may exceed a distance 805 between the corner points 801a and 801b. The protective layer 833 may at least partially overlap a rigid region (e.g., the curable material 232c of the rigid region 232) to be excessive in a second axis (e.g., the Y-axis) direction (e.g., the vertical direction) as much as a designated size (e.g., approximately 0.4 mm) with reference to the corner points 801a and 801b. The protective layer 833 may be laminated not to overlap at least one via hole 803 formed through the rigid region.

Meanwhile, FIGS. 6A, 6B, 6C, 7 and 8 illustrate that a rigid-flexible printed circuit board may include two cut regions, but according to an embodiment, a rigid-flexible printed circuit board may include a cut region on one side thereof.

Figure 9:
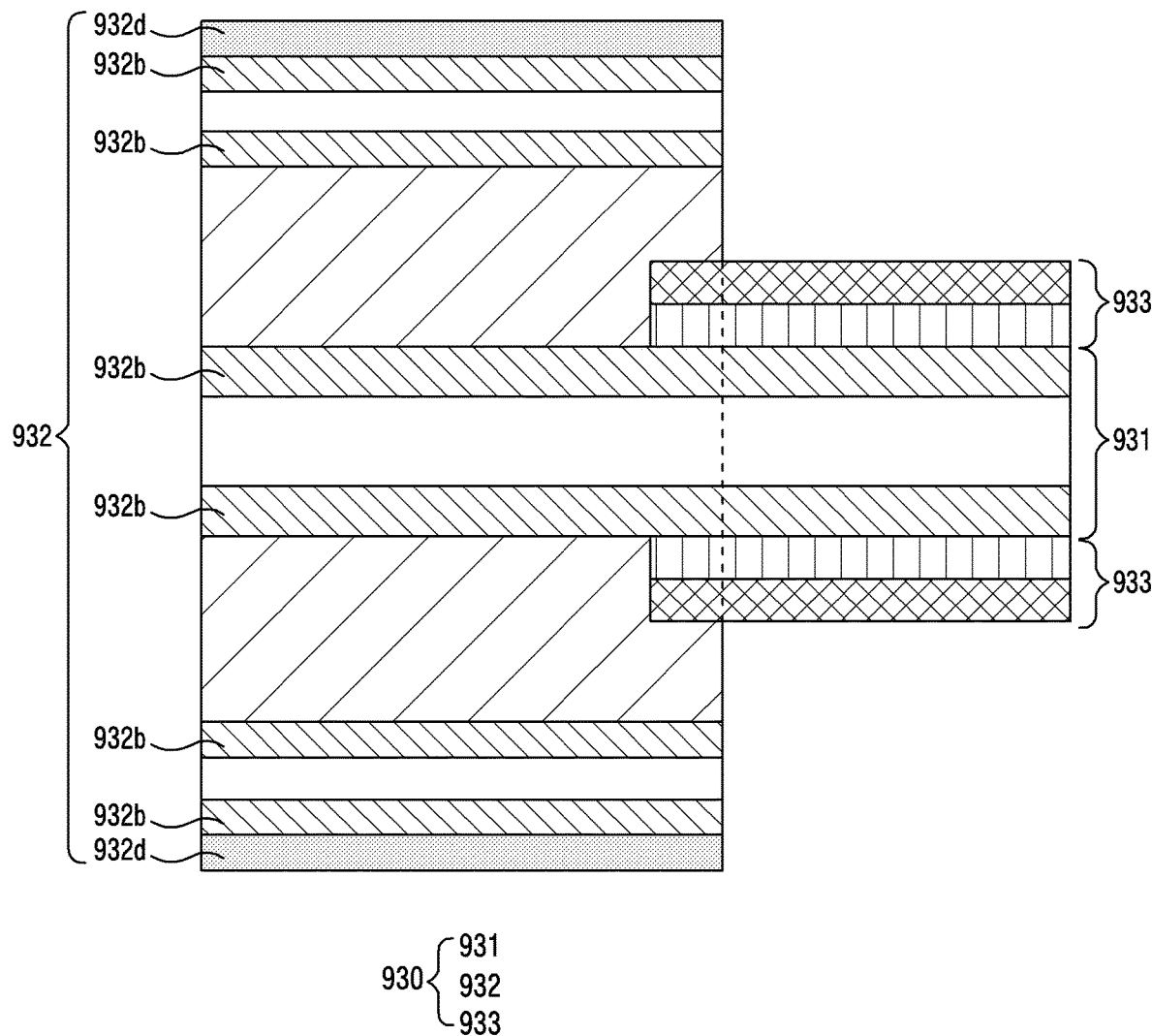
FIG. 9 is a cross-sectional view illustrating an example coupling portion of a rigid-flexible printed circuit board according to various embodiments.

FIG. 9 is a cross-sectional view illustrating an example coupling portion of a rigid-flexible printed circuit board according to various embodiments.

Referring to FIG. 9, a rigid-flexible printed circuit board 930 according to another embodiment may include a flexible region 931, a rigid region 932, and a protective layer 933. The rigid region 932 of the rigid-flexible printed circuit board 930 according to another embodiment may include six copper clad layers 932b, and two protective layers 932d, and other elements of the rigid-flexible printed circuit board may be the same as or similar to the elements of the rigid-flexible printed circuit board 230 of FIGS. 4 and 5. Therefore, the detailed description thereof may not be repeated here.

Figure 10:
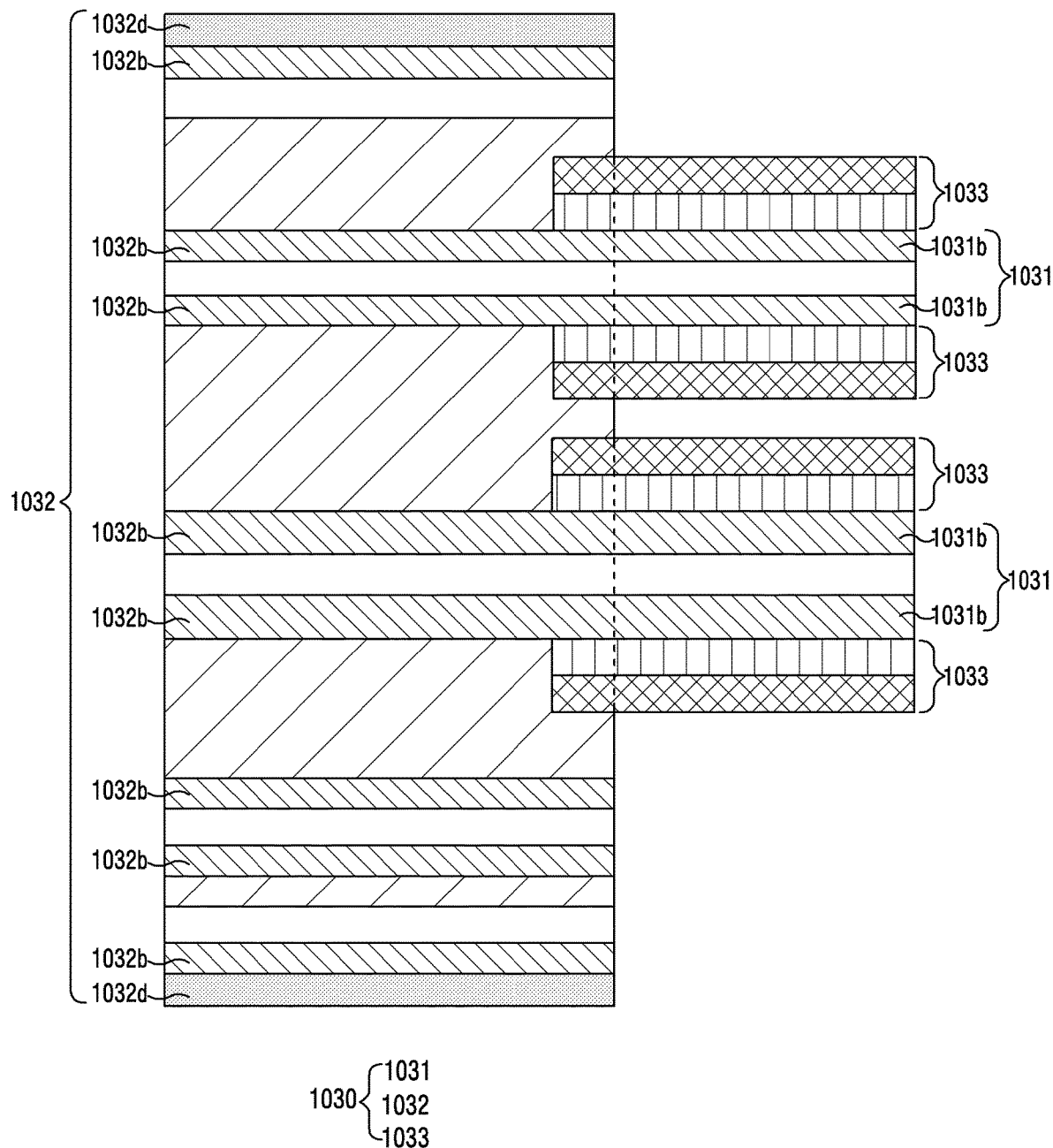
FIG. 10 is a cross-sectional view illustrating an example coupling portion of a rigid-flexible printed circuit board according to various embodiments.

FIG. 10 is a cross-sectional view illustrating an example coupling portion of a rigid-flexible printed circuit board according to various embodiments.

Referring to FIG. 10, a rigid-flexible printed circuit board 1030 according to various embodiments may include a flexible region 1031, a rigid region 1032, and a protective layer 1033. Therefore, in the rigid-flexible printed circuit board 1030 according to ab embodiment, the flexible region 1031 may include four copper clad layers 1031b, and the rigid region 1032 may include eight copper clad layers 1032b and two protective layers 1032d. In addition, the rigid-flexible printed circuit board may include four protective layers 1033. Other elements of the rigid-flexible printed circuit board may be the same as or similar to the elements of the rigid-flexible printed circuit board 230 of FIGS. 4 and 5 and/or the rigid-flexible printed circuit board 930 of FIG. 9. Therefore, the detailed description thereof will not be repeated here.

According to various example embodiments, an electronic device (e.g., the electronic device 101) may comprise: a housing (e.g., the housing 200); a first module including various circuitry disposed in one region of the housing; a second module including various circuitry disposed in an other region of the housing and spaced apart from the first module; and a rigid-flexible printed circuit board (e.g., the rigid-flexible printed circuit board 230) configured to electrically connect the first module and the second module. The rigid-flexible printed circuit board may comprise: a rigid region (e.g., the rigid region 232, 932, 1032); a flexible region (e.g., the flexible region 231, 931, 1031) coupled to the rigid region wherein a part of the flexible region overlaps the rigid region; and a protective layer (e.g., the protective layer 233, 633, 733, 833, 933, 1033) laminated on at least one of an upper end or a lower end of the flexible region covering at least a part of a coupling portion of the rigid region and the flexible region by a designated numerical value, the coupling portion to having a tensile strength equal to or greater than a designated strength based on the flexible region being bent.

According to various example embodiments, the designated numerical value may include at least one of a size, a range, and/or a ratio related to the coupling portion, and the designated numerical value may cover beyond a point having a maximum stress occurring at the coupling portion based on the protective layer being bent.

According to various example embodiments, the coupling portion may include a U-shaped, a R-shaped, or an L-shaped cut region (e.g., the cut region 602, 702, 802).

According to various example embodiments, a point having a maximum stress may include a lowest point (e.g., the lowest point 601a, 601b) of the U-shaped cut region, an end point (e.g., the end point 701a, 701b) of a curved portion (curvature) of the R-shaped cut region, or a corner point (e.g., the corner point 801a, 801b) of the L-shaped cut region.

According to various example embodiments, the first module and the second module may be different modules among a display module (the display module 160, 210, 360), a main printed circuit board (e.g., the printed circuit board 220, the first printed circuit board 310, the printed circuit board 350), a sub printed circuit board (e.g., the second printed circuit board 320), a camera module (e.g., the camera module 180), an interface module (e.g., the interface 177), or a sensor module (e.g., the sensor module 176).

According to various example embodiments, at least a part of the flexible region may include a base film (e.g., the base film 231a), and include a flexible copper clad layer (FCCL) comprising at least one copper clad layer laminated on at least one of an upper end or a lower end of the base film.

According to various example embodiments, the rigid region may include at least one copper clad layer (e.g., the copper clad layer 232b) bonded to at least one of an upper end or a lower end of a part of the flexible region by a curable material (e.g., the curable material 232c), and be disposed at an end of the flexible region or on each of both ends thereof.

According to various example embodiments, the protective layer may be laminated on the flexible region to not overlap a via hole (e.g., the via hole 603, 703, 803) extending through at least a part of the rigid region.

According to various example embodiments, the protective layer may include a base film (e.g., the base film 233a) coated with an adhesive agent (e.g., the adhesive agent 233b).

According to various example embodiments, a rigid-flexible printed circuit board (e.g., the rigid-flexible printed circuit board 230) configured to electrically connect a first module including various circuitry and a second module including various circuitry may comprise: a rigid region (e.g., the rigid region 232, 932, 1032); a flexible region (e.g., the flexible region 231, 931, 1031) coupled to the rigid region wherein a part of the flexible region overlaps the rigid region; and a protective layer (e.g., the protective layer 233, 633, 733, 833, 933, 1033) laminated on at least one of an upper end or a lower end of the flexible region to cover at least a part of a coupling portion of the rigid region and the flexible region by a designated numerical value, the coupling portion having a tensile strength equal to or greater than a designated strength based on the flexible region being bent.

According to various example embodiments, the designated numerical value may include at least one of a size, a range, and/or a ratio related to the coupling portion, and the designated numerical value may cover beyond a point having a maximum stress occurring at the coupling portion when the protective layer is bent.

According to various example embodiments, the coupling portion may include a U-shaped, a R-shaped, or an L-shaped cut region (e.g., the cut region 602, 702, 802).

According to various example embodiments, a point having a maximum stress may include a lowest point (e.g., the lowest point 601a, 601b) of the U-shaped cut region, an end point (e.g., the end point 701a, 701b) of a curved portion (curvature) of the R-shaped cut region, or a corner point (e.g., the corner point 801a, 801b) of the L-shaped cut region.

According to various example embodiments, the first module and the second module may be different modules among a display module (the display module 160, 210, 360), a main printed circuit board (e.g., the printed circuit board 220, the first printed circuit board 310, the printed circuit board 350), a sub printed circuit board (e.g., the second printed circuit board 320), a camera module (e.g., the camera module 180), an interface module (e.g., the interface 177), or a sensor module (e.g., the sensor module 176).

According to various example embodiments, at least a part of the flexible region may include a base film (e.g., the base film 231a), including a flexible copper clad layer (FCCL) comprising at least one copper clad layer laminated on at least one of an upper end or a lower end of the base film.

According to various example embodiments, the rigid region may include at least one copper clad layer (e.g., the copper clad layer 232b) bonded to at least one of an upper end or a lower end of a part of the flexible region by a curable material (e.g., the curable material 232c), and disposed on an end of the flexible region or on each of both ends thereof.

According to various example embodiments, the protective layer may be laminated on the flexible region to not overlap a via hole (e.g., the via hole 603, 703, 803) extending through at least a part of the rigid region.

According to various example embodiments, the protective layer may comprise a base film (e.g., the base film 233a) and an adhesive agent (e.g., the adhesive agent 233b).

According to various example embodiments, an electronic device (e.g., the electronic device 101) may comprise a housing (e.g., the housing 200); a first module including various circuitry disposed in one region of the housing; a second module including various circuitry disposed in another region of the housing and spaced apart from the first module; and a rigid-flexible printed circuit board (e.g., the rigid-flexible printed circuit board 230) configured to electrically connect the first module and the second module. The rigid-flexible printed circuit board may comprise: a rigid region (e.g., the rigid region 232, 932, 1032); a flexible region (e.g., the flexible region 231, 931, 1031) coupled to the rigid region wherein a part of the flexible region overlaps the rigid region; and a protective layer (e.g., the protective layer 233, 633, 733, 833, 933, 1033) laminated on at least one of an upper end or a lower end of the flexible region to cover at least a part of a coupling portion of the flexible region and the rigid region, and having a length in a direction substantially perpendicular to a bending direction in which the flexible region is bent, greater than a minimum length between lowest points of the coupling portion.

According to various example embodiments, the bending direction may be a direction of rotation around a boundary between the rigid region and the flexible region. The perpendicular direction may correspond to a rotation-axis direction for the rotation.

Various embodiments can prevent and/or reduce damage and/or rupture of a coupling portion of a rigid-flexible printed circuit board, which is incurred due to bending stress, by increasing the rigidity of the coupling portion. In addition, various embodiments can reduce the defective rate of an electronic device, due to damage and/or rupture of a rigid-flexible printed circuit board.

The effects resulting from the disclosure are not limited to the effects mentioned above, and other effects, which are not mentioned above, could be clearly understood by a person having ordinary skill in the art.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by one skilled in the art that various changes in form and detail may be made without departing from the true spirit and full scope of the disclosure, including the appended claims and their equivalents.

What is claimed is:

1. An electronic device comprising:
   a housing;
   a first module, comprising circuitry, disposed in one region of the housing;
   a second module, comprising circuitry, disposed in another region of the housing and spaced apart from the first module; and
   a rigid-flexible printed circuit board electrically connecting the first module and the second module,
   wherein the rigid-flexible printed circuit board comprises:
   a rigid region;
   a flexible region coupled to the rigid region, wherein a part of the flexible region overlaps the rigid region; and
   a protective layer laminated on at least one of an upper end or a lower end of the flexible region to cover at least a part of a coupling portion of the rigid region and the flexible region by a designated numerical value in an area where the rigid region and the flexible region overlap each other, the coupling portion to having a tensile strength equal to or greater than a designated strength, and wherein the coupling portion includes at least one of a U-shaped cut region, a round-shaped cut region, or an L-shaped cut region of the flexible region when viewed in a direction substantially perpendicular to the protective layer, and
   wherein the protective layer overlaps a portion of the flexible region in coupling portion, and
   wherein the protective layer overlaps at least a portion of at least one of the U-shaped cut region, the round-shaped cut region, or the L-shaped cut region.

2. The electronic device of claim 1, wherein the designated numerical value includes at least one of a size, a range, and/or a ratio related to the coupling portion, and
   the designated numerical value covers beyond a point having a maximum stress occurring at the coupling portion based on the protective layer being bent.

3. The electronic device of claim 2, wherein the point having the maximum stress includes a lowest point of the U-shaped cut region, an end point of a curved portion of the R-shaped cut region, or a corner point of the L-shaped cut region.

4. The electronic device of claim 1, wherein the first module and the second module are different modules among a display module, a main printed circuit board, a sub printed circuit board, a camera module, an interface module, or a sensor module.

5. The electronic device of claim 1, wherein at least a part of the flexible region includes a base film, and includes a flexible copper clad layer (FCCL) comprising at least one copper clad layer laminated on at least one of an upper end or a lower end of the base film.

6. The electronic device of claim 1, wherein the rigid region comprises at least one copper clad layer bonded to at least one of an upper end or a lower end of a part of the flexible region by a curable material, and disposed on an end of the flexible region or on each of both ends of the flexible region.

7. The electronic device of claim 1, wherein the protective layer is laminated on the flexible region to not overlap a via hole included in at least a part of the rigid region.

8. The electronic device of claim 1, wherein the protective layer comprises a base film coated with an adhesive agent.

9. A rigid-flexible printed circuit board configured to electrically connect a first module and a second module, the rigid-flexible printed circuit board comprising:
a rigid region;
a flexible region coupled to the rigid region, wherein a part of the flexible region overlaps the rigid region; and
a protective layer laminated on at least one of an upper end or a lower end of the flexible region to cover at least a part of a coupling portion of the rigid region and the flexible region in an area where the rigid region and the flexible region overlap each other, and wherein the coupling portion includes at least one of a U-shaped cut portion, a round-shaped cut portion, or an L-shaped cut region of the flexible region when viewed in a direction substantially perpendicular to the protective layer, and
wherein the protective layer is overlapped a portion of the flexible region in coupling portion, and
the protective layer is overlapped at least a portion of at least one of the U-shaped cut region, the round-shaped cut region, or the L-shaped cut region.

10. The rigid-flexible printed circuit board of claim 9, wherein the designated numerical value includes at least one of a size, a range, and/or a ratio related to the coupling portion, and
the designated numerical value covers beyond a point having a maximum stress occurring at the coupling portion based on the protective layer being bent.

11. The rigid-flexible printed circuit board of claim 10, wherein the point having the maximum stress includes a lowest point of the U-shaped cut region, an end point of a curved portion of the R-shaped cut region, or a corner point of the L-shaped cut region.

12. The rigid-flexible printed circuit board of claim 9, wherein the first module and the second module are different modules among a display module, a main printed circuit board, a sub printed circuit board, a camera module, an interface module, or a sensor module.

13. The rigid-flexible printed circuit board of claim 9, wherein at least a part of the flexible region includes a base film, and comprises a flexible copper clad layer (FCCL) including at least one copper clad layer laminated on at least one of an upper end or a lower end of the base film.

14. The rigid-flexible printed circuit board of claim 9, wherein the rigid region includes at least one copper clad layer bonded to at least one of an upper end or a lower end of a part of the flexible region by a curable material, and is disposed on an end of the flexible region or on each of both ends of the flexible region.

15. The rigid-flexible printed circuit board of claim 9, wherein the protective layer is laminated on the flexible region to not overlap a via hole included in at least a part of the rigid region.

16. The rigid-flexible printed circuit board of claim 9, wherein the protective layer comprises a base film coated with an adhesive agent.

17. An electronic device comprising:
a housing;
a first module disposed in one region of the housing;
a second module disposed in an other region of the housing and spaced apart from the first module; and
a rigid-flexible printed circuit board electrically connecting the first module and the second module,
wherein the rigid-flexible printed circuit board comprises:
a rigid region;
a flexible region coupled to the rigid region, wherein a part of the flexible region overlaps the rigid region; and
a protective layer laminated on at least one of an upper end or a lower end of the flexible region to cover at least a part of a coupling portion of the flexible region and the rigid region in an area where the rigid region and the flexible region overlap each other, the protective layer having a length in a direction substantially perpendicular to a bending direction in which the flexible region is configured to be bent, greater than a minimum length between lowest points of the coupling portion, and
wherein the coupling portion includes at least one of a U-shaped cut region, a round-shaped cut region, or an L-shaped cut region of the flexible region when viewed in a direction substantially perpendicular to the protective layer, and
wherein the protective layer is overlapped a portion of the flexible region in coupling portion, and
the protective layer is overlapped at least a portion of at least one of the U-shaped cut region, the round-shaped cut region, or the L-shaped cut region.

18. The electronic device of claim 17, wherein the bending direction is a direction of rotation about a boundary between the rigid region and the flexible region, and
the perpendicular direction corresponds to a rotation-axis direction for the rotation.

* * * * *